(12) United States Patent
Ye (10) Patent No.: US 11,902,739 B2
(45) Date of Patent: Feb. 13, 2024

(54) DISPLAY DEVICE FOR GENERATING SOUND FROM DISPLAY PANEL

(71) Applicant: LG Display Co., Ltd., Seoul (KR)

(72) Inventor: Jae-Hun Ye, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 21 days.

(21) Appl. No.: 17/111,321

(22) Filed: Dec. 3, 2020

(65) Prior Publication Data
US 2021/0176566 A1    Jun. 10, 2021

(30) Foreign Application Priority Data

Dec. 4, 2019    (JP) ................................. 2019-219414

(51) Int. Cl.
| | |
|---|---|
| *H04R 17/00* | (2006.01) |
| *H01L 27/32* | (2006.01) |
| *H04R 1/02* | (2006.01) |
| *H04R 1/26* | (2006.01) |
| *H10K 59/00* | (2023.01) |

(52) U.S. Cl.
CPC ............. *H04R 17/00* (2013.01); *H04R 1/028* (2013.01); *H04R 1/26* (2013.01); *H10K 59/00* (2023.02); *H04R 2400/03* (2013.01); *H04R 2499/15* (2013.01)

(58) Field of Classification Search
CPC ....................... H04R 17/00–10; H04R 2499/15
See application file for complete search history.

(56) References Cited

U.S. PATENT DOCUMENTS

| | | | |
|---|---|---|---|
| 6,747,395 B1* | 6/2004 | Satoh .................... | H04R 17/005 310/327 |
| 2004/0183407 A1* | 9/2004 | Takeshima ............. | H04R 17/00 310/331 |
| 2013/0241352 A1* | 9/2013 | Hayashi .................. | H04M 1/03 310/323.01 |
| 2014/0111065 A1 | 4/2014 | Kobayashi | |
| 2014/0139983 A1 | 5/2014 | Suzuki et al. | |
| 2017/0105294 A1* | 4/2017 | Shimoda .................... | B06B 1/06 |
| 2018/0269808 A1* | 9/2018 | Park ......................... | H04R 1/22 |
| 2019/0116406 A1 | 4/2019 | Ahn et al. | |

(Continued)

FOREIGN PATENT DOCUMENTS

| | | |
|---|---|---|
| CN | 104461115 A | 3/2015 |
| CN | 104751743 A | 7/2015 |

(Continued)

OTHER PUBLICATIONS

English machine translation of KR 10-2006-0021224 (Kim et al., Piezoelectric Vibrator With Asymmetric I-Type Elastomer and Piezoelectric Panel Speaker Using the Same, published Mar. 2006) (Year: 2006) (Year: 2006).*

(Continued)

*Primary Examiner* — Mark Fischer
(74) *Attorney, Agent, or Firm* — POLSINELLI PC (57) ABSTRACT

A display device includes a piezoelectric element vibrated according to input audio signals, a display panel configured to display an image, and an elastic member configured to connect a portion of the piezoelectric element and the display panel so as to transmit a vibration of the piezoelectric element to the display panel to improve sound quality in a display device which emits a sound from a display panel.

9 Claims, 9 Drawing Sheets

(56) References Cited

U.S. PATENT DOCUMENTS

2019/0141424 A1   5/2019   Kim et al.
2019/0163234 A1   5/2019   Kim et al.

FOREIGN PATENT DOCUMENTS

| | | | |
|---|---|---|---|
| JP | 54-118230 A | 9/1979 | |
| JP | 2003-520540 A | 7/2003 | |
| JP | 2005-168137 A | 6/2005 | |
| JP | 2008-079180 A | 4/2008 | |
| JP | 2013-038755 A | 2/2013 | |
| JP | 2013-229794 A | 11/2013 | |
| JP | 2014-165851 A | 9/2014 | |
| JP | 2015-219528 A | 12/2015 | |
| KR | 20060021224 A * | 3/2006 | ........... H04R 1/1058 |
| KR | 10-2018-0077582 A | 7/2018 | |
| WO | 2005/024966 A1 | 3/2005 | |

OTHER PUBLICATIONS

Japanese Office Action dated Sep. 22, 2021 issued in corresponding Patent Application No. 2019-219414 w/English Translation (13 pages).

European Search Report dated Feb. 24, 2021 issued in European Patent Application No. 20211535.8 (9 pages).

Chinese Office Action dated Jun. 28, 2022 issued in Patent Application No. 202011407749.X (8 pages).

European Office Action dated Feb. 16. 2023 issued in Patent. Application No. 20 211 535.8 (7 pages).

\* cited by examiner

DISPLAY DEVICE FOR GENERATING SOUND FROM DISPLAY PANEL

CROSS-REFERENCE TO RELATED APPLICATION

This application claims the benefit of Japanese Patent Application No. 2019-219414, filed on Dec. 4, 2019, which is hereby incorporated by reference in its entirety.

BACKGROUND

Field of the Disclosure

The present disclosure relates to a display device.

Description of the Background

A display device including a display panel and an actuator, and having a function of vibrating the display panel by controlling the actuator is disclosed in Korean Patent Publication No. 10-2018-0077582A.

In order to improve a sense of realism or the like, a display device, which emits a sound by allowing a display panel itself to function as a speaker, is being considered. However, although a display panel is allowed to function as a speaker through a structure disclosed in Korea Patent Publication No. 10-2018-0077582A, sound quality may not be sufficient.

SUMMARY

Accordingly, the present disclosure is directed to improving sound quality in a display device which emits a sound from a display panel.

According to an aspect of the present disclosure, there is provided a display device including a piezoelectric element vibrated according to input audio signals, a display panel configured to display an image, and an elastic member configured to connect a portion of the piezoelectric element and the display panel so as to transmit a vibration of the piezoelectric element to the display panel.

According to another aspect of the present disclosure, there is provided a display device including a piezoelectric element which includes a first vibration part and a second vibration part extending in different directions when viewed from above and is vibrated according to input audio signals, a display panel configured to display an image, and an elastic member configured to connect a portion of the piezoelectric element and the display panel so as to transmit a vibration of the piezoelectric element to the display panel.

According to still another aspect of the present disclosure, there is provided a display device including a plurality of piezoelectric elements vibrated according to input audio signals, and a display panel configured to display an image, wherein each of the plurality of piezoelectric elements is connected to the display panel to transmit a vibration to the display panel, and a first piezoelectric element and a second piezoelectric element among the plurality of piezoelectric elements have different frequency characteristics.

BRIEF DESCRIPTION OF THE DRAWINGS

The accompanying drawings, which are included to provide a further understanding of the disclosure, are incorporated in and constitute a part of the disclosure, illustrate implementations of the disclosure and together with the description serve to explain the principles of aspects of the disclosure.

DETAILED DESCRIPTION

Hereinafter, aspects according to the present disclosure will be described in detail with reference to the accompanying drawings. In each drawing, the same numerals are assigned to the elements having the common function, and redundant descriptions thereof will be omitted or simplified.

<First Aspect>

Figure 1:
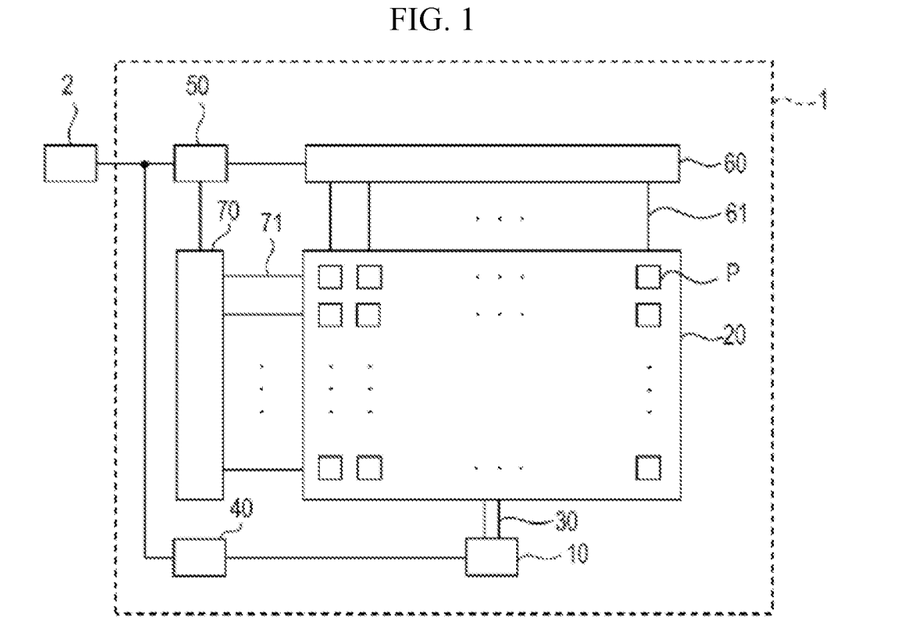
FIG. 1 is a schematic block diagram of a display device according to a first aspect.

FIG. 1 is a schematic block diagram of a display device 1 according to a first aspect. The display device 1 of the present aspect may be, for example, used for an image output device of a computer, a television receiver, a smartphone, a game console, and the like, but the present disclosure is not particularly limited thereto.

As shown in FIG. 1, the display device 1 includes a piezoelectric element 10, a display panel 20, an elastic member 30, a first controller 40, a second controller 50, a data driving circuit 60, and a gate driving circuit 70. The display device 1 is a device that displays an image on the display panel 20 on the basis of input RGB data or the like and generates a sound based on an input audio signal or the like.

The display panel 20 includes a plurality of pixels P arranged to form a plurality of rows and a plurality of columns. The display device 1 may be, for example, an organic light-emitting diode (OLED) display using an OLED as a light-emitting element of the pixel P. When the display device 1 is capable of displaying a color image, the pixel P may be a subpixel that displays any one of a plurality of colors (for example, red (R), green (G), and blue (B)) constituting the color image.

The piezoelectric element 10 is an element that is displaced by an inverse piezoelectric effect when a voltage based on an input audio signal is applied. The piezoelectric element 10 may be, for example, an element such as a bimorph element or a unimorph element, which is flexural-displaced according to a voltage. Since the input audio signal is usually an alternating current (AC) voltage, the piezoelectric element 10 functions as a vibration element that vibrates according to the input audio signal.

The elastic member 30 is a member made of a material having elasticity. As a material of the elastic member 30, a material such as rubber having an elastic modulus smaller than that of the piezoelectric element 10 and the display panel 20 is typically used. A portion of the piezoelectric element 10 and a portion of the display panel 20 are connected by the elastic member 30. As a result, a vibration of the piezoelectric element 10 is transmitted to the display panel 20, and the display panel 20 emits a sound based on the input audio signal.

A host system 2 is a system including a device or a plurality of devices for controlling the display device 1 by supplying an image signal (for example, RGB data), an audio signal, and timing signals (vertical synchronization signal, horizontal synchronization signal, data enable signal, and the like). The host system 2 may be, for example, a television system, a set-top box, a navigation system, an optical disk player, a computer, a home theater system, a video phone system, or the like. Furthermore, the display device 1 and the host system 2 may be an integrated device or may be separate devices.

The first controller 40 supplies a voltage to the piezoelectric element 10 on the basis of the audio signal and the timing signal input from the host system 2.

The second controller 50 controls the data driving circuit 60 and the gate driving circuit 70 on the basis of the image data and the timing signals input from the host system 2. The data driving circuit 60 supplies a data voltage or the like to the plurality of pixels P through a driving line 61 disposed for each column of the plurality of pixels P. The gate driving circuit 70 supplies control signals to the plurality of pixels P through a driving line 71 disposed for each row of the plurality of pixels P. Furthermore, each of the driving line 61 and the driving line 71 may be provided with a plurality of lines.

Each of the first controller 40, the second controller 50, the data driving circuit 60, and the gate driving circuit 70 may be provided as one or more semiconductor integrated circuits. In addition, some or all of the first controller 40, the second controller 50, the data driving circuit 60, and the gate driving circuit 70 may be integrally provided as one semiconductor integrated circuit.

Figure 2:
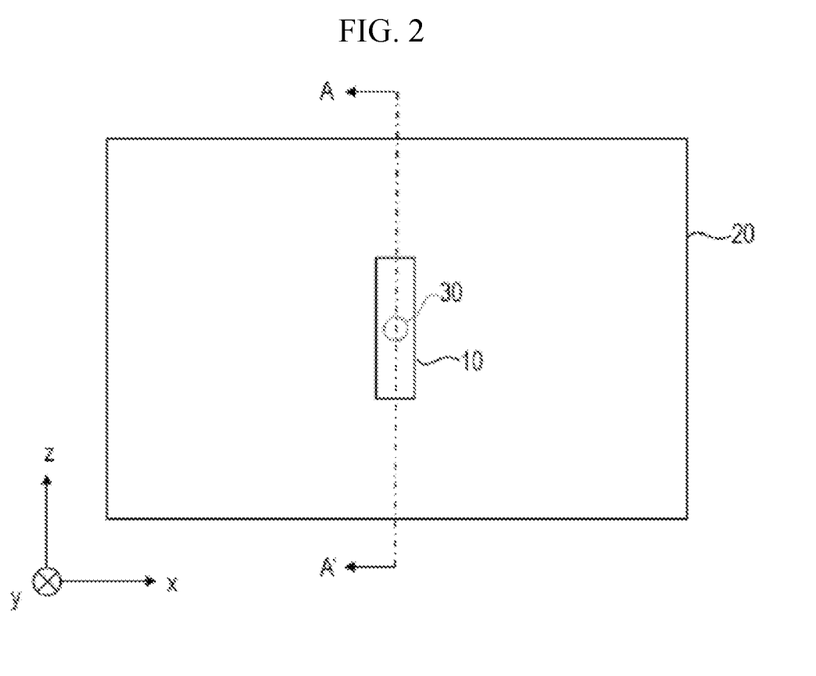
FIG. 2 is a plan view illustrating a schematic configuration of a piezoelectric element according to the first aspect.
Figure 3:
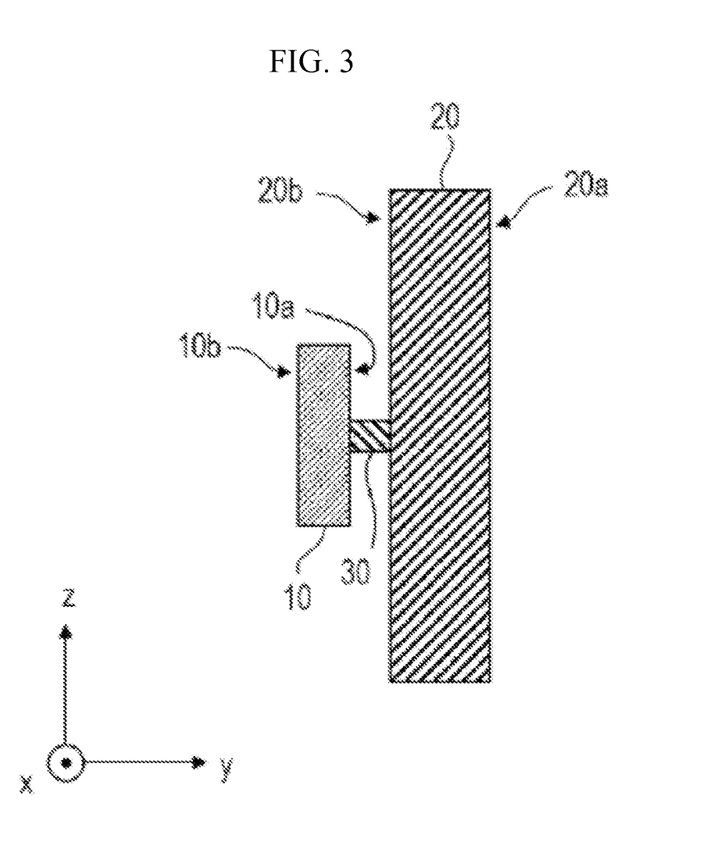
FIG. 3 is a cross-sectional view illustrating the schematic configuration of the piezoelectric element according to the first aspect.

FIG. 2 is a plan view illustrating a schematic configuration of the piezoelectric element 10 according to the first aspect. FIG. 3 is a schematic cross-sectional view illustrating the configuration of the piezoelectric element 10 according to the first aspect. The layout of the piezoelectric element 10 will be described with reference to FIGS. 2 and 3. In FIG. 2, a rectangular outline of the display panel 20 schematically shows an exterior of the display panel 20.

As shown in FIG. 3, a surface of the display panel 20 on which an image is displayed is an image display surface 20a, and a surface thereof opposite to the image display surface 20a is a rear surface 20b. In this case, FIG. 2 is a plan view of the display panel 20 viewed from the rear surface 20b. FIG. 2 illustrates coordinate axes in which a horizontal direction of the image display surface 20a corresponds to an x-axis, a vertical direction of the image display surface 20a corresponds to a z-axis, and a depth direction of the image display surface 20a corresponds to a y-axis. Furthermore, a direction from the rear surface 20b toward the image display surface 20a is a forward direction of the y-axis. FIG. 3 is a cross-sectional view taken along line A-A' in FIG. 2.

The piezoelectric element 10 has a flat plate shape. As shown in FIG. 2, the piezoelectric element 10 has a rectangular shape having a long side direction (z direction in the drawing) and a short side direction (x direction in the drawing) when viewed from above. As a result, deformation such as bending occurs when viewed from a cross section (line A-A') in the long side direction. The piezoelectric element 10 is disposed such that the long side direction is perpendicular to an end of the display panel 20.

The elastic member 30 is connected at a position including a center of the piezoelectric element 10 in the long side direction. Since the center of the piezoelectric element 10 in the long side direction becomes a center of a vibration, the vibration is efficiently transmitted to the display panel 20.

As shown in FIG. 3, the piezoelectric element 10 has a first main surface 10a and a second main surface 10b. The elastic member 30 connects the first main surface 10a of the piezoelectric element 10 and the rear surface 20b of the display panel 20. As described above, the piezoelectric element 10 and the elastic member 30 are disposed on the rear surface 20b of the display panel 20 so as to not interfere with when a user views the image display surface 20a.

The elastic member 30 is connected only to a portion of the first main surface 10a of the piezoelectric element 10. Since both ends of the piezoelectric element 10 in the long side direction are in a floating state, a displacement of a flexural vibration is great in the both ends in the long side direction, and thus, the vibration of the piezoelectric element 10 is difficult to disrupt.

Figure 4:
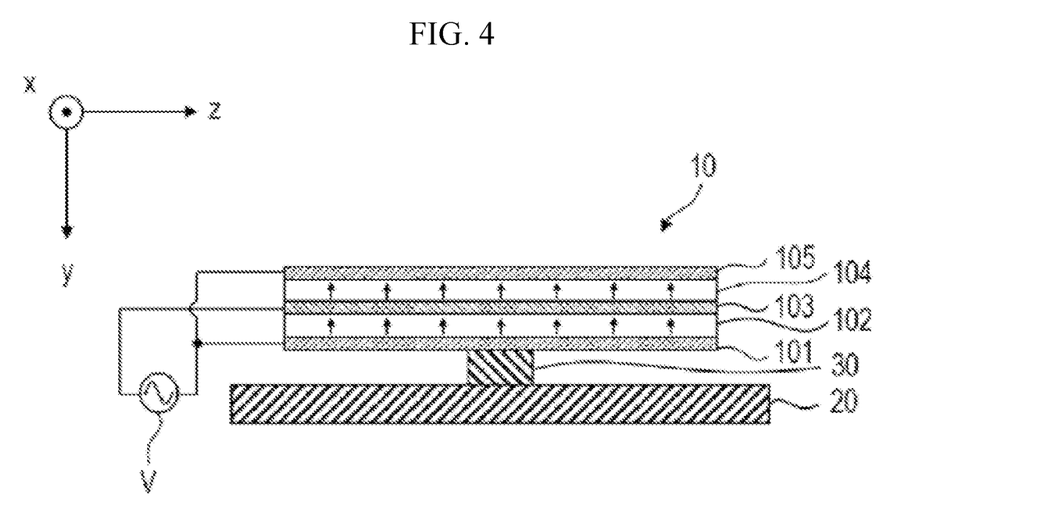
FIG. 4 is a cross-sectional view illustrating a structure of the piezoelectric element according to the first aspect in more detail.

FIG. 4 is a cross-sectional view illustrating a structure of the piezoelectric element 10 according to the first aspect in more detail. Although the direction of FIG. 4 is different from that of FIG. 3, like FIG. 3, FIG. 4 is a cross-sectional view along line A-A' of FIG. 2. In addition, FIG. 4 schematically illustrates a connection relationship between electrodes included in the piezoelectric element 10 using a circuit diagram in order to describe a method of inputting an audio signal to the piezoelectric element 10.

The piezoelectric element 10 shown in FIG. 4 has a structure referred to as a bimorph in which two piezoelectric layers are stacked. The piezoelectric element 10 includes electrodes 101, 103 and 105 and piezoelectric layers 102 and 104. The electrode 101 (first electrode) installed at a side closest to the display panel 20 is connected to the elastic member 30. The electrode 101 and the electrode 103 (second electrode) are disposed such that the piezoelectric layer 102 (first piezoelectric layer) is interposed therebetween in a thickness direction thereof. The electrode 103 and the electrode 105 (third electrode) are disposed such that the piezoelectric layer 104 (second piezoelectric layer) is interposed therebetween in a thickness direction thereof. Arrows shown inside the piezoelectric layers 102 and 104 indicate polarization directions of the piezoelectric layers 102 and 104. That is, the polarization directions of the piezoelectric layer 102 and the piezoelectric layer 104 are the same. Furthermore, lines for applying voltages to the electrodes may be connected to the electrodes 101, 103 and 105 through soldering or the like, but the illustration of the lines is omitted in FIG. 4.

Since a voltage applied to the piezoelectric element 10 is based on an audio signal, the voltage may be considered as an AC voltage according to a frequency of a sound to be generated. In FIG. 4, the AC voltage is illustrated by circuit symbol V of an AC power source. One terminal of the AC power source V is connected to the electrodes 101 and 105, and the other terminal thereof is connected to the electrode 103. In other words, voltages having the same phase are applied to the electrode 101 and the electrode 105, voltages having opposite phases are applied to the electrode 101 and the electrode 103, and voltages having opposite phases are also applied to the electrode 103 and the electrode 105. Accordingly, voltages in opposite directions are applied to the piezoelectric layer 102 and the piezoelectric layer 104.

A material of the piezoelectric layers 102 and 104 is not particularly limited, but a material having excellent piezoelectricity such as lead zirconate titanate may be used because the material may increase a displacement amount. In addition, although not shown in the configuration of FIG. 4, an outer periphery of the piezoelectric element 10 may be covered with an insulator such as a resin in order to avoid a short circuit with other members.

Figure 5:
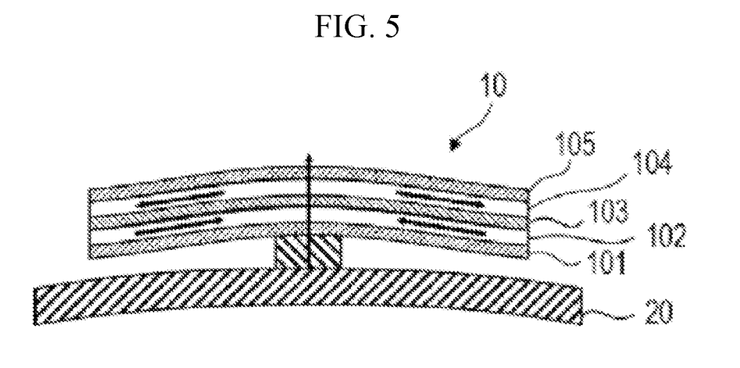
FIG. 5 is a schematic view illustrating deformation of the piezoelectric element to which a voltage is applied according to the first aspect.
Figure 6:
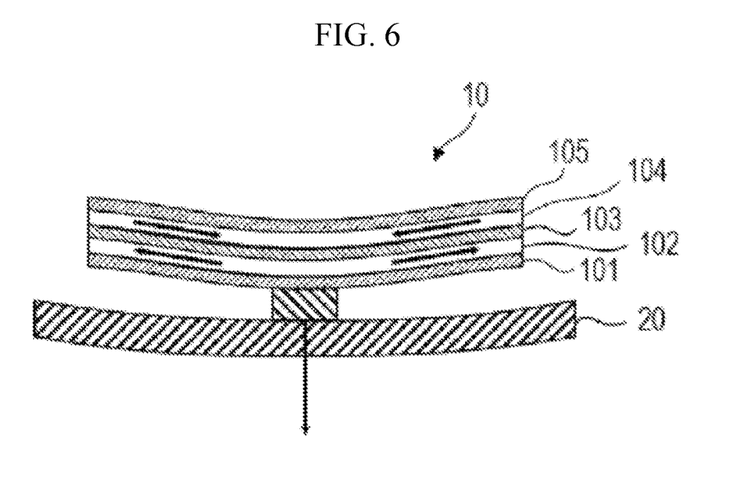
FIG. 6 is a schematic view illustrating deformation of the piezoelectric element to which a voltage is applied according to the first aspect.

FIGS. 5 and 6 are schematic views illustrating deformation of the piezoelectric element 10 to which a voltage is applied according to the first aspect. As shown in FIG. 4, the polarization directions of the piezoelectric layers 102 and 104 are the same direction, and voltages in opposite directions are applied to the piezoelectric layers 102 and 104. Accordingly, expansion and contraction directions of the piezoelectric layer 102 and the piezoelectric layer 104 are opposite.

As shown in FIG. 5, at a timing when the piezoelectric layer 102 is deformed so as to contract in a lateral direction, the piezoelectric layer 104 is deformed to expand in the lateral direction. Accordingly, an end of the piezoelectric element 10 is bent in a direction toward the display panel 20. In this case, the display panel 20 is deformed by receiving stress in a direction toward the piezoelectric element 10.

As shown in FIG. 6, at a timing when the piezoelectric layer 102 is deformed to expand in the short side direction, the piezoelectric layer 104 is deformed to contract in the short side direction. Accordingly, the end of the piezoelectric element 10 is bent in a direction away from the display panel 20. In this case, the display panel 20 is deformed by receiving stress in a direction away from the piezoelectric element 10.

When an AC voltage based on an audio signal is applied to the piezoelectric element 10, the state of FIG. 5 and the state of FIG. 6 are alternately repeated at a frequency of a sound. As described above, a vibration of the piezoelectric element 10 is transmitted to the display panel 20, and the display panel 20 vibrates. Accordingly, since a sound based on an audio signal is emitted from the display panel 20, the display panel 20 functions as a speaker.

Figure 7:
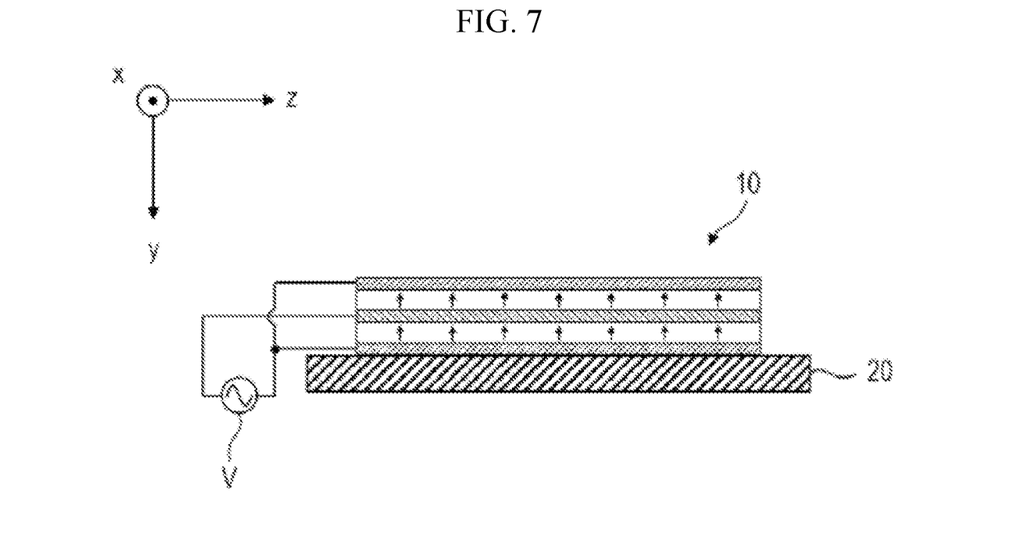
FIG. 7 is a cross-sectional view illustrating a structure of a piezoelectric element according to a comparative example.
Figure 8:
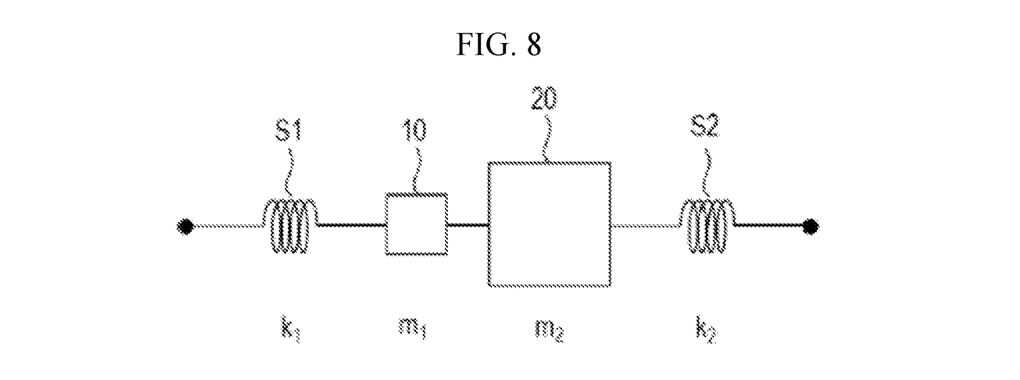
FIG. 8 is a schematic view illustrating a vibration model according to the comparative example.
Figure 9:
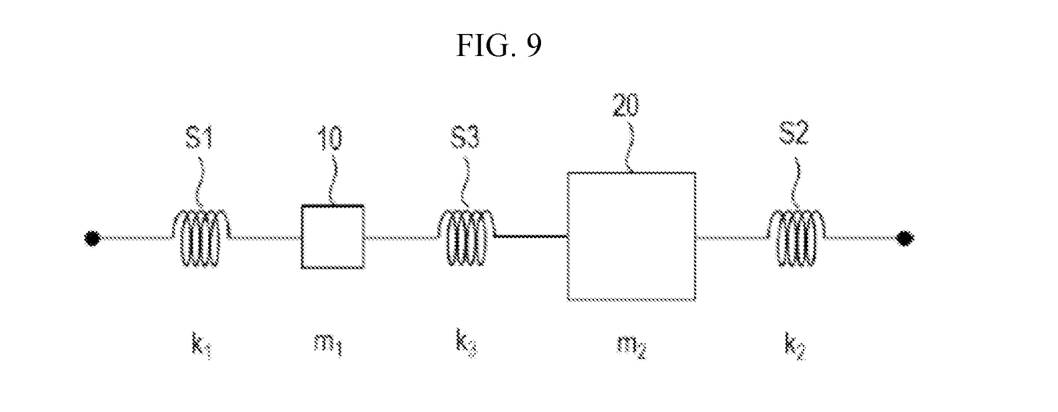
FIG. 9 is a schematic view illustrating a vibration model according to the first aspect.

In the present aspect, effects obtained by connecting the portion of the piezoelectric element 10 and the display panel 20 through the elastic member 30 will be described in more detail with reference to FIGS. 7 to 9. FIG. 7 is a cross-sectional view illustrating a configuration of a piezoelectric element 10 according to a comparative example. FIG. 8 is a schematic view illustrating a vibration model according to the comparative example. FIG. 9 is a schematic view illustrating a vibration model according to the first aspect.

As shown in FIG. 7, in the comparative example, a front surface of the piezoelectric element 10 is connected directly to a display panel 20. Even in such a configuration, a displacement of the piezoelectric element 10 is transmitted to the display panel 20 to allow the display panel 20 to function as a speaker.

In the vibration model according to the comparative example, as shown in FIG. 8, springs S1 and S2 are connected to both ends of a material point showing the piezoelectric element 10 and the display panel 20. The piezoelectric element 10 having mass $m_1$ and the display panel 20 having mass $m_2$ are directly connected.

The spring S1 having a spring constant $k_1$ is connected to the piezoelectric element 10, and the spring S2 having a spring constant $k_2$ is connected to the display panel 20. The spring S1 is a model of elasticity of the piezoelectric element 10. The spring S2 is a model of the display panel 20 itself or a member such as a housing for restricting the display panel 20. In addition, both ends in the present vibration model are typically fixed ends.

In the vibration model of the comparative example, the piezoelectric element 10 and the display panel 20 may be replaced with one material point having mass $m_1+m_2$. When a voltage is applied to the piezoelectric element 10, a force generated by the piezoelectric element 10 vibrates the entirety of both of the piezoelectric element 10 and the display panel 20 having the mass $m_1+m_2$. Here, since the display panel 20 is much larger than the piezoelectric element 10, the mass $m_1+m_2$ is much greater than the mass $m_1$. Since the force generated by the piezoelectric element 10 is applied to an object having very large mass, acceleration of the piezoelectric element 10 and the display panel 20 due to the force is small. Accordingly, a displacement amount of the piezoelectric element 10 and the display panel 20 is not so large, and in the configuration of the comparative example, sound pressure of a sound emitted from the display panel 20 may not be sufficient.

On the other hand, in the vibration model according to the present aspect, as shown in FIG. 9, a spring S3 having a spring constant k3 is connected between material points showing the piezoelectric element 10 and the display panel 20. The spring S3 is a model of elasticity of the elastic member 30. The piezoelectric element 10 having mass m1 and the display panel 20 having mass m2 are connected through the spring S3.

In the vibration model of the present aspect, the piezoelectric element 10 and the display panel 20 are independently displaced. A force generated when a voltage is applied to the piezoelectric element 10 vibrates the piezoelectric element 10 having the mass $m_1$. Since mass of an object to which a force is applied is small as compared with the case of the comparative example, acceleration of the piezoelectric element 10 due to the force is greater than that of the comparative example. As a result, the piezoelectric element 10 resonates in a large displacement range. Since the displacement of the piezoelectric element 10 is gradually transmitted to the display panel 20 through the spring S3, the displacement is difficult to disturb due to the mass of the display panel 20 as in the case of the comparative example. Therefore, in the present aspect, when compared to the case of the comparative example, the displacement can be increased, and the sound pressure can be improved.

As described above, according to the present aspect, when the display panel 20 functions as a speaker, the display device 1, which is capable of improving sound quality by improving sound pressure of a sound generated by the display panel 20, is provided.

In addition, in the present aspect, a vibration source is the piezoelectric element 10, but a sound source is the display panel 20 having large mass and a low natural frequency. Therefore, when compared to a configuration in which a sound is generated directly from the piezoelectric element 10 or a configuration in which a sound is generated from a member having a high natural frequency such as a configuration in which the piezoelectric element 10 is connected to a small diaphragm separate from the display panel 20, it is possible to improve sound pressure in bass.

<Second Aspect>

In the present aspect, a modified example of the layout of the piezoelectric element 10 according to the first aspect will be described. Since the basic configuration of a display device 1, the structure of a piezoelectric element 10, and the like are the same as those of the first aspect, descriptions thereof will be omitted.

Figure 10:
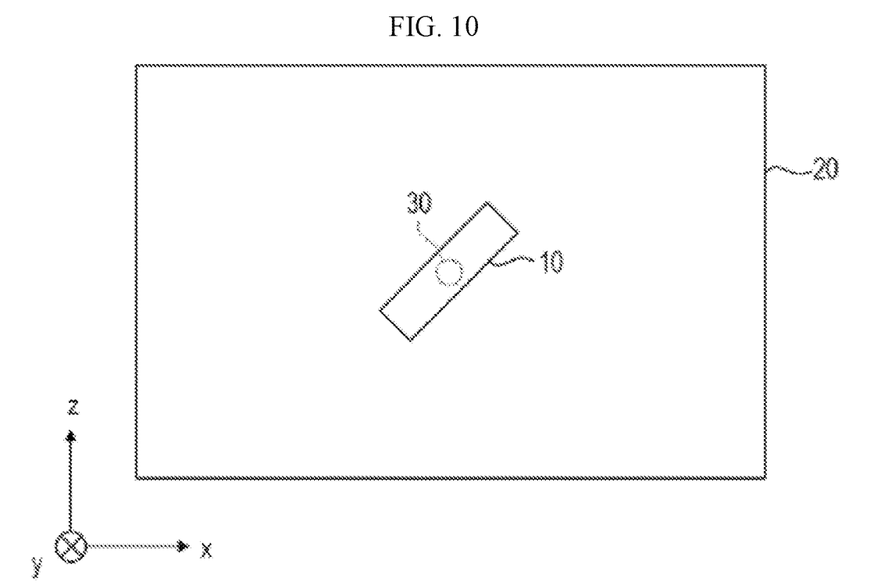
FIG. 10 is a plan view illustrating a schematic configuration of a piezoelectric element according to a second aspect.

FIG. 10 is a plan view illustrating a schematic configuration of the piezoelectric element 10 according to a second aspect. As shown in FIG. 10, in the present aspect, the piezoelectric element 10 is disposed such that a long side direction of the piezoelectric element 10 is not perpendicular to any one of ends of a display panel 20.

When the piezoelectric element 10 has a rectangular shape, in a distribution of vibrations generated in the display panel 20, a main component of the vibration is a component directed in the long side direction of the piezoelectric element 10. As in the first aspect, when the long side direction of the piezoelectric element 10 is perpendicular to the end of the display panel 20, a vibration generated by the piezoelectric element 10 and a vibration reflected from the end of the display panel 20 may be reinforced to generate a resonance. The resonance may cause noise. On the other hand, in the present aspect, since the long side direction of the piezoelectric element 10 is not perpendicular to any one of the ends of the display panel 20, a resonance due to the above-described factors is difficult to generate, thereby reducing noise.

Accordingly, according to the present aspect, the same effect as in the first aspect is obtained, and simultaneously, noise due to a resonance generated by reflection from an end surface of the display panel 20 is reduced, thereby providing the display device 1 having improved sound quality.

In addition, since vibration reinforcement occurs in the configuration of the first aspect, in some cases, sound pressure improvement, frequency characteristic adjustment, or the like are possible by using the vibration reinforcement. Therefore, according to design conditions such as required characteristics and design constraints, in some cases, it is desirable to make the long side direction of the piezoelectric element 10 perpendicular to the end of the display panel 20 as in the first aspect.

<Third Aspect>

In the present aspect, a modified example of the cross-sectional structure of the piezoelectric element 10 according to the first aspect will be described. Since the basic configuration of a display device 1, the structure of a piezoelectric element 10, and the like are the same as those of the first aspect, descriptions thereof will be omitted.

Figure 11:
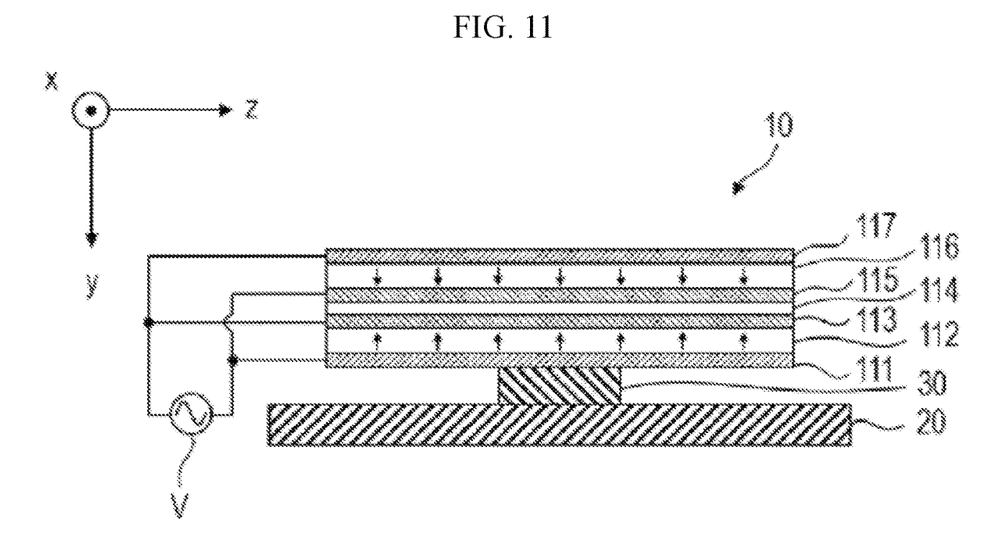
FIG. 11 is a cross-sectional view illustrating a structure of a piezoelectric element according to a third aspect.

FIG. 11 is a cross-sectional view illustrating the structure of the piezoelectric element 10 according to a third aspect. The position of a cross section is the same as that in FIGS. 3 and 4.

The piezoelectric element 10 includes electrodes 111, 113, 115 and 117, piezoelectric layers 112 and 116, and an insulating layer 114. The electrode 111 (first electrode) installed at a side closest to a display panel 20 is connected to an elastic member 30. The electrode 111 and the electrode 113 (second electrode) are disposed such that the piezoelectric layer 112 (first piezoelectric layer) is interposed therebetween in a thickness direction thereof. The electrode 115 (third electrode) and the electrode 117 (fourth electrode) are disposed such that the piezoelectric layer 116 (second piezoelectric layer) is interposed therebetween in a thickness direction thereof. The insulating layer 114 is disposed between the electrode 113 and the electrode 115. The insulating layer 114 is a layer that secures an insulating property between the electrode 113 and the electrode 115. Arrows shown inside the piezoelectric layers 112 and 116 indicate polarization directions of the piezoelectric layers 112 and 116. That is, the polarization directions of the piezoelectric layer 112 and the piezoelectric layer 116 are opposite.

One terminal of a current power source V showing a voltage based on an audio signal is connected to the electrodes 111 and 115, and the other terminal thereof is connected to the electrodes 113 and 117. In other words, voltages having the same phase are applied to the electrode 111 and the electrode 115. Voltages having a phase opposite to that of the voltages input to the electrode 111 and the electrode 115 are applied to the electrode 113 and the electrode 117. Accordingly, voltages in the same direction are applied to the piezoelectric layer 112 and the piezoelectric layer 116.

Even in the present aspect, when one of the two piezoelectric layers contracts in a lateral direction, a flexural vibration occurs in the same manner as in the first aspect. Therefore, even in the present aspect, the same effect as in the case of the first aspect can be obtained. As described above, the structure of the piezoelectric element 10, the structure of the electrodes, and the like are not limited to the structures of the first aspect, and various structures can be applied.

For example, the piezoelectric element 10 may have a structure referred to as a unimorph in which one piezoelectric layer, a pair of electrodes with the piezoelectric layer interposed therebetween, and a vibration plate are stacked. However, in order to improve the conversion efficiency between a voltage and a displacement, it is desirable to adopt a bimorph structure as shown in FIG. 4 or 11.

<Fourth Aspect>

In the present aspect, a modified example of the structure of the piezoelectric element 10 according to the first aspect will be described. Since the basic configuration and the like of a display device 1 are the same as those of the first aspect, descriptions thereof will be omitted.

Figure 12:
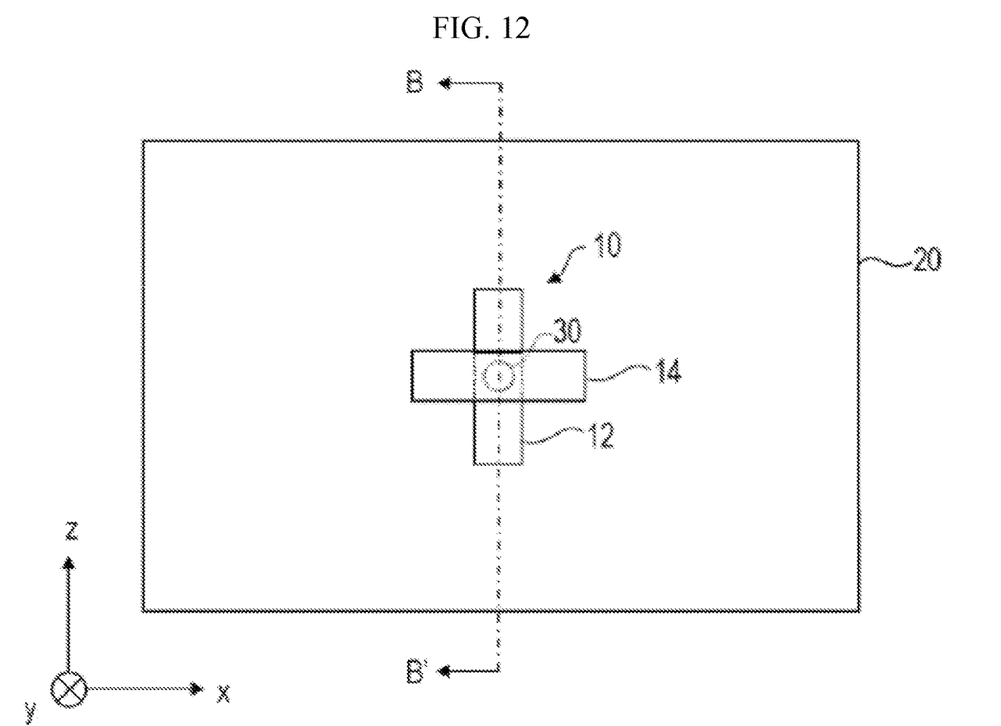
FIG. 12 is a plan view illustrating a schematic configuration of a piezoelectric element according to a fourth aspect.
Figure 13:
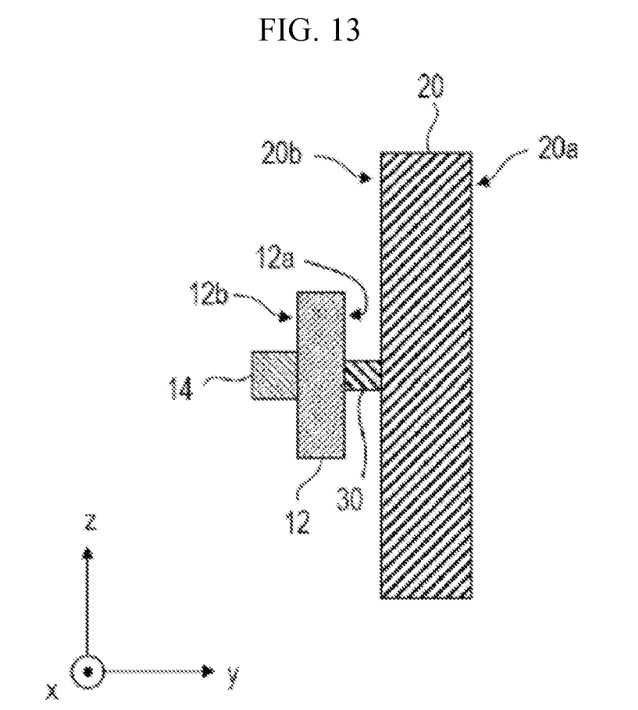
FIG. 13 is a cross-sectional view illustrating the schematic configuration of the piezoelectric element according to the fourth aspect.

FIG. 12 is a plan view illustrating a schematic configuration of a piezoelectric element 10 according to a fourth aspect. FIG. 13 is a cross-sectional view illustrating the schematic configuration of the piezoelectric element 10 according to the fourth aspect. The layout of the piezoelectric element 10 will be described with cross-reference to FIGS. 12 and 13.

As shown in FIG. 12, the piezoelectric element 10 of the present aspect includes a first vibration part 12 and a second vibration part 14 extending in different directions when viewed from above. A configuration of the first vibration part 12 is the same as that of the piezoelectric element 10 of the first aspect. The first vibration part 12 has a rectangular shape having a long side direction (z direction in the drawing) and a short side direction (x direction in the drawing) when viewed from above. The second vibration part 14 extends in a direction different from that of the first vibration part 12. That is, the second vibration part 14 has a rectangular shape having a long side direction (x direction in the drawing) and a short side direction (z direction in the drawing) when viewed from above. The long side direction of the first vibration part 12 and the long side direction of the second vibration part 14 are perpendicular to each other. In addition, the long side direction of the first vibration part 12 and the long side direction of the second vibration part 14 are both perpendicular to an end of a display panel 20.

As shown in FIG. 13, the first vibration part 12 has a first main surface 12a and a second main surface 12b. An elastic member 30 connects the first main surface 12a of the first vibration part 12 and a rear surface 20b of the display panel 20. The elastic member 30 is connected only to a portion of the first main surface 12a of the first vibration part 12. As described above, the piezoelectric element 10 and the elastic member 30 are disposed on the rear surface 20b of the display panel 20 so as to not interfere with when a user views an image display surface 20a.

The second vibration part 14 is connected only to a portion of the second main surface 12b of the first vibration part 12. Thus, both ends of the first vibration part 12 in the long side direction are in a floating state, and also, both ends of the second vibration part 14 in the long side direction are in a floating state. When both ends of the piezoelectric element 10 in the long side direction are in a floating state, a displacement of a flexural vibration is great in the both ends in the long side direction, and thus, the vibration of the piezoelectric element 10 is difficult to disrupt.

Figure 14:
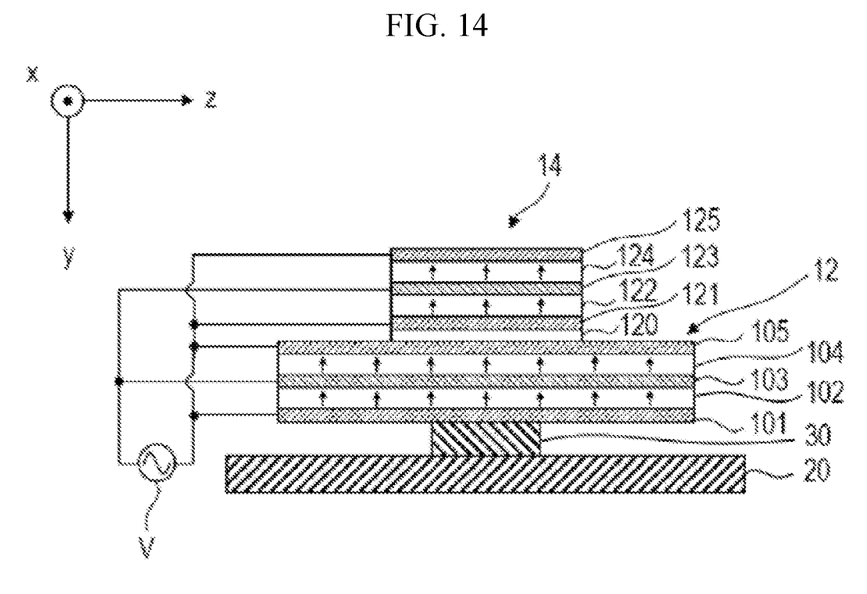
FIG. 14 is a cross-sectional view illustrating a structure of the piezoelectric element according to the fourth aspect in more detail.

FIG. 14 is a cross-sectional view illustrating the structure of the piezoelectric element 10 according to the fourth aspect in more detail. Although the direction of FIG. 14 is different from that of FIG. 13, like FIG. 13, FIG. 14 is a cross-sectional view along line B-B' of FIG. 12. In addition, FIG. 14 schematically illustrates a connection relationship between electrodes included in the piezoelectric element 10 using a circuit diagram in order to describe a method of inputting an audio signal to the piezoelectric element 10.

The piezoelectric element 10 shown in FIG. 14 has a structure in which two bimorphs are stacked. The piezoelectric element 10 includes the first vibration part 12 and the second vibration part 14. The structure of the first vibration part 12 is the same as that of the piezoelectric element 10 of the first aspect. In FIG. 14, an insulating layer 120 is provided between the first vibration part 12 and the second vibration part 14 but is not essential.

The second vibration part 14 includes electrodes 121, 123, and 125 and piezoelectric layers 122 and 124. The electrode 121 installed at a side closest to the first vibration part 12 is connected to the insulating layer 120. The electrodes 121 and 123 are disposed such that the piezoelectric layer 122 is interposed therebetween in a thickness direction thereof. The electrodes 123 and 125 are disposed such that the piezoelectric layer 124 is interposed therebetween in a thickness direction thereof. Arrows shown inside the piezoelectric layers 122 and 124 indicate polarization directions of the piezoelectric layers 122 and 124. That is, the polarization directions of the piezoelectric layer 122 and the piezoelectric layer 124 are the same.

One terminal of an AC power source V showing a voltage based on an audio signal is connected to the electrodes 101, 105, 121, and 125, and the other terminal thereof is connected to the electrodes 103 and 123. In other words, voltages having the same phase are applied to the electrodes 101, 105, 121, and 125. Voltages having a phase opposite to that of the voltages input to the electrodes 101, 105, 121, and 125 are applied to the electrodes 103 and 123. Accordingly, voltages in the same direction are applied to the piezoelectric layers 102, 104, 122, and 124.

Even in both of the first vibration part 12 and the second vibration part 14, when one of the two piezoelectric layers contracts in a lateral direction, the other thereof expands in the lateral direction. Accordingly, both the first vibration part 12 and the second vibration part 14 are flexural-vibrated in the same manner as in the first aspect. Further, by setting the polarization direction and the voltage direction as described above, the first vibration part 12 and the second vibration part 14 vibrate in the same phase according to an audio signal. As a result, a vibration generated by the first vibration part 12 and a vibration generated by the second vibration part 14 are reinforced to improve vibration efficiency.

According to the present aspect, similarly to the first aspect, the display device 1, which is capable of improving sound quality by improving sound pressure of a sound generated by the display panel 20, is provided. In addition, since the piezoelectric element 10 of the present aspect uses two vibration parts, sound pressure can be further improved as compared with the configuration of the first aspect in which one vibration part is provided.

Furthermore, in the first aspect, since only one vibration part is provided, a vibration distribution is concentrated in the long side direction of the piezoelectric element 10, that is, is concentrated one-dimensionally. Therefore, a resonance is likely to occur in the display panel 20, and noise caused by the resonance may be increased. On the other hand, in the present aspect, since the piezoelectric element 10 includes the first vibration part 12 and the second vibration part 14 extending in different directions, a vibration distribution is two-dimensional, and it is difficult for the vibration distribution to be concentrated on a specific part. Therefore, it is difficult for a resonance to occur in the display panel 20. Accordingly, in the present aspect, noise due to a resonance in the display panel 20 is reduced, and the display device 1 having improved sound quality is provided.

<Fifth Aspect>

In the present aspect, a modified example of the layout of the piezoelectric element 10 according to the fourth aspect will be described. Since the basic configuration of a display device 1, the structure of a piezoelectric element 10, and the like are the same as those of the fourth aspect, descriptions thereof will be omitted.

Figure 15:
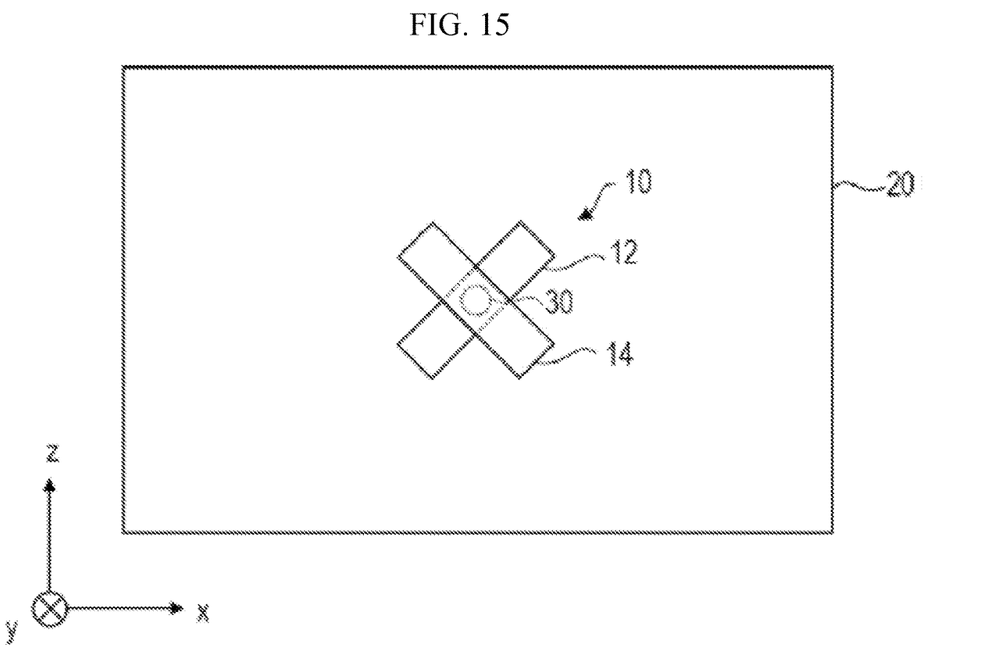
FIG. 15 is a plan view illustrating a schematic configuration of a piezoelectric element according to a fifth aspect.

FIG. 15 is a plan view illustrating a schematic configuration of the piezoelectric element 10 according to a fifth aspect. As shown in FIG. 15, in the present aspect, the piezoelectric element 10 is disposed such that long side directions of a first vibration part 12 and a second vibration part 14 are not perpendicular to any one of ends of a display panel 20.

As described in the description of the second aspect, vibrations generated by the first vibration part 12 and the second vibration part 14 and vibration reflected from the end of the display panel 20 may be reinforced to generate a resonance. The resonance may cause noise. On the contrary, in the present aspect, long side directions of the first vibration part 12 and the second vibration part 14 are not perpendicular to any one of the ends of the display panel 20, and thus a resonance is difficult to generate, thereby reducing noise.

Therefore, according to the present aspect, the same effect as in the fourth aspect is obtained, and concurrently, noise, which is caused by a resonance generated due to reflection from an end surface of the display panel 20, is reduced, thereby providing a display device 1 having improved sound quality.

In addition, in the configuration of the fourth aspect, in some cases, a design for sound pressure improvement, frequency characteristic adjustment, or the like is possible by using vibration reinforcement. Therefore, according to design conditions such as required characteristics and design constraints, in some cases, it is desirable to make the long side direction of the piezoelectric element 10 perpendicular to the end of the display panel 20 as in the fourth aspect.

<Sixth Aspect>

In the present aspect, a modified example of the structure of the piezoelectric element 10 according to the fourth aspect will be described. The basic configuration and the like of a display device 1 are the same as those of the fourth aspect, and thus descriptions thereof will be omitted.

Figure 16:
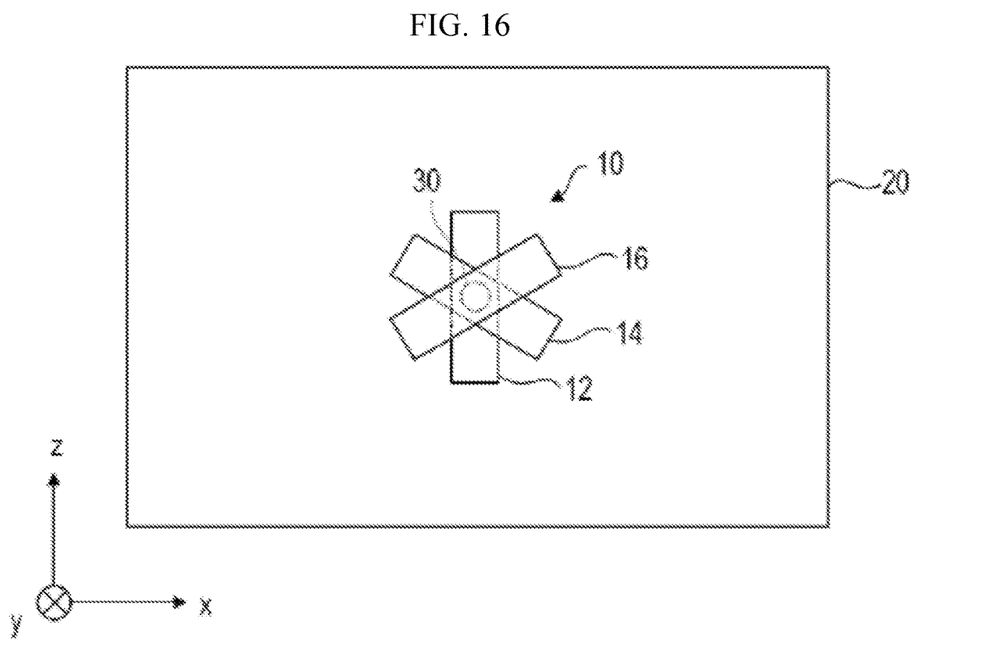
FIG. 16 is a plan view illustrating a schematic configuration of a piezoelectric element according to a sixth aspect.

FIG. 16 is a plan view illustrating a schematic configuration of a piezoelectric element 10 according to a sixth aspect. As shown in FIG. 16, the piezoelectric element 10 of the present aspect includes a first vibration part 12, a second vibration part 14, and a third vibration part 16 extending in different directions when viewed from above. Since only the number of layers is increased by adding piezoelectric layers and electrodes corresponding to the third vibration part 16 to the structure of FIG. 14, descriptions of a cross-sectional structure of the piezoelectric element 10 will be omitted.

In the present aspect, similarly to the first aspect, a display device 1 capable of improving sound pressure of a sound generated by the display panel 20 is provided. In addition, since the piezoelectric element 10 of the present aspect uses three vibration parts, sound pressure can be further improved as compared with the configuration of the fourth aspect having two vibration parts. As described above, the number of vibration parts is not limited to one or two and may be three or more. As the number of vibration parts is increased, sound pressure is improved.

In addition, in the present aspect, a vibration distribution is more uniform two-dimensionally as compared with the configuration of the fourth aspect. Therefore, a vibration is more difficult to generate in the display panel 20. Accordingly, according to the present aspect, noise due to a resonance in the display panel 20 is further reduced, and the display device 1 having improved sound quality is provided.

<Seventh Aspect>

In the present aspect, a modified example of the structure of the piezoelectric element 10 according to the first aspect will be described. The basic configuration and the like of a display device 1 are the same as those of the first aspect, and thus descriptions thereof will be omitted.

Figure 17:
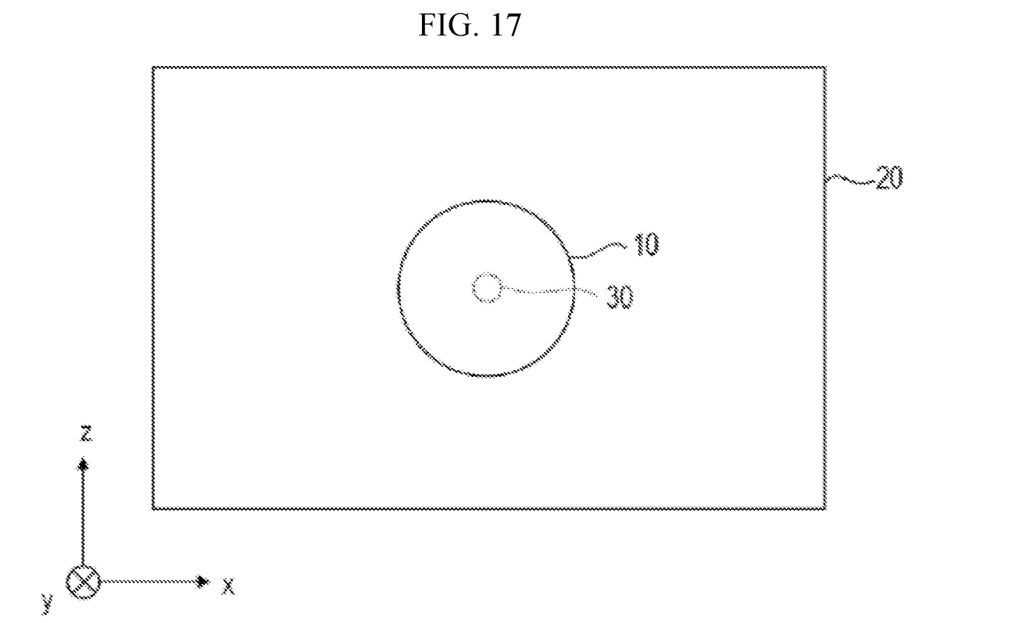
FIG. 17 is a plan view illustrating a schematic configuration of a piezoelectric element according to a seventh aspect.

FIG. 17 is a plan view illustrating a schematic configuration of a piezoelectric element 10 according to a seventh aspect. The piezoelectric element 10 has a flat plate shape. As shown in FIG. 17, the piezoelectric element 10 of the present aspect has a circular shape when viewed from above. An elastic member 30 is connected at a position including a center of a circle of the piezoelectric element 10. Since a cross-sectional structure of the piezoelectric element 10 is the same as that in FIGS. 3 and 4, descriptions thereof will be omitted.

In the present aspect, similarly to the first aspect, a display device 1 capable of improving sound pressure of a sound generated by a display panel 20 is provided.

In addition, in the present aspect, since the piezoelectric element 10 has the circular shape, the vibration distribution is two-dimensionally uniform. Therefore, a resonance is difficult to generate in the display panel 20 for the same reason as in the case of the fourth aspect. Therefore, according to the present aspect, noise caused by a resonance in the display panel 20 is reduced, thereby providing the display device 1 having improved sound quality.

<Eighth Aspect>

In the present aspect, a modified example of the structure of the piezoelectric element 10 according to the fifth aspect will be described. The basic configuration and the like of a display device 1 are the same as those of the fifth aspect, and thus descriptions thereof will be omitted.

Figure 18:
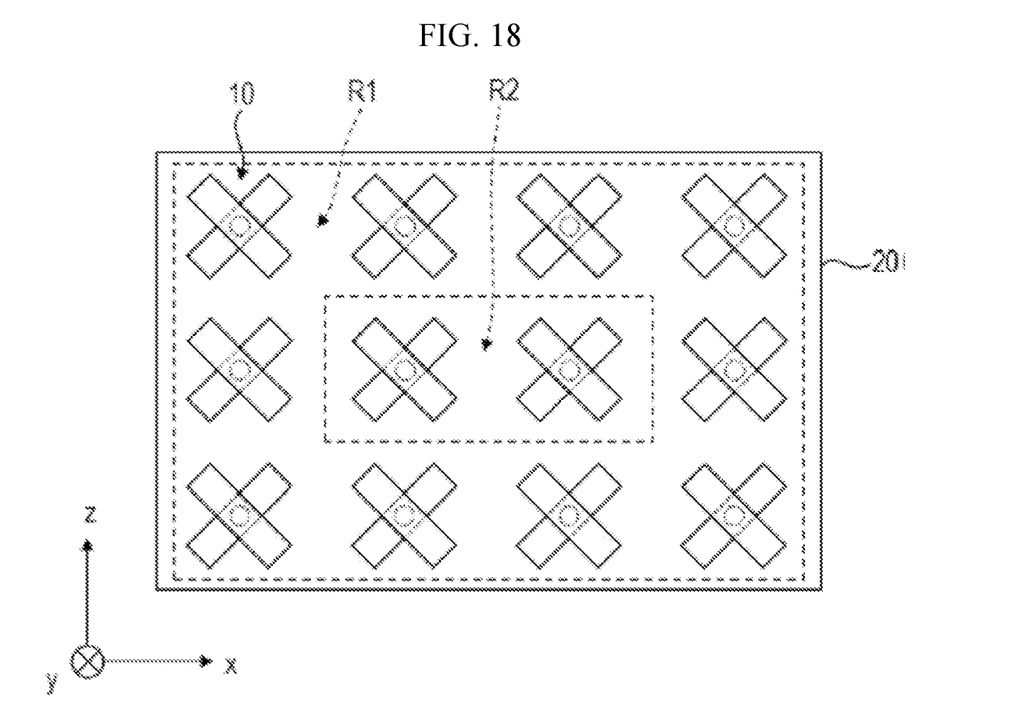
FIG. 18 is a plan view illustrating the layout of a piezoelectric element according to an eighth aspect.

FIG. 18 is a plan view illustrating the layout of a piezoelectric element 10 according to an eighth aspect. As shown in FIG. 18, in the present aspect, a plurality of piezoelectric elements 10 are disposed on a display panel 20. The plurality of piezoelectric elements 10 are arranged in a matrix in an x direction and a z direction. The piezoelectric element 10 is the same as that of the fifth aspect. The plurality of piezoelectric elements 10 are disposed on the display panel 20, and thus, sound pressure of a sound generated by the display panel 20 is improved as compared to the case of one piezoelectric element.

The display panel 20 includes a region R1 and a region R2. The piezoelectric element 10 (first piezoelectric element) in the region R1 and the piezoelectric element 10 (second piezoelectric element) in the region R2 have different frequency characteristics. For example, the frequency characteristics of the two piezoelectric elements are made to be different from each other, thereby reducing the bias of a frequency characteristic of a sound generated by the display panel 20.

Since the piezoelectric element 10 has a natural frequency due to a shape or the like thereof, the piezoelectric element 10 may have a biased frequency characteristic such as sound pressure at a specific frequency being increased. When the characteristics of all the piezoelectric elements 10 of the display panel 20 are the same, the biases of the frequency characteristics of the plurality of piezoelectric elements 10 overlap each other, and thus the frequency characteristics of the entire display panel 20 may be biased. In the present aspect, the frequency characteristic of the piezoelectric element 10 in the region R1 and the frequency characteristic of the piezoelectric element 10 in the region R2 are made to be different from each other and be leveled off, thereby reducing the bias of the frequency characteristic that may occur due to the above-described factors.

The bias of the frequency characteristic of the piezoelectric element 10 is mainly caused by a natural frequency of the piezoelectric element 10. Therefore, it is desirable to make the natural frequency of the piezoelectric element 10 in the region R1 different from the natural frequency of the piezoelectric element 10 in the region R2. For example, by making the natural frequency of the piezoelectric element 10 in the region R2 lower than the natural frequency of the piezoelectric element 10 in the region R1, the region R1 functions as a high-pitched tone generating region, and the region R2 functions as a low-pitched tone generating region. Therefore, the display device 1 capable of generating bass and treble in balance is provided.

The natural frequency of the piezoelectric element 10 depends on the shape or material of the piezoelectric element 10. Accordingly, the piezoelectric element 10 in the region R1 and the piezoelectric element 10 in the region R2 may have different natural frequencies by making shapes or sound speeds different from each other. As examples of material properties that affect a sound speed in a material, there are an elastic modulus and density. Therefore, it is desirable to use materials that differ in any one of a sound speed, elastic modulus, and density. In addition, when the piezoelectric element 10 in the region R1 and the piezoelectric element 10 in the region R2 are made to differ only in shape, a material may be used in common, which is desirable.

As described above, according to the present aspect, the bias of a frequency characteristic of a sound generated the display panel 20 is reduced, thereby providing the display device 1 having improved sound quality.

In addition, although the piezoelectric element 10 of the fifth aspect has been described as an example of the piezoelectric element 10 applicable to the present aspect, the present disclosure is not limited thereto. The piezoelectric element 10 having any structure or layout among the first to seventh aspects may be used, or a piezoelectric element having a different structure or layout from that described in the first to seventh aspects may be used.

<Other Aspects>

The above-described aspects are merely several exemplary aspects to which the present disclosure can be applied, and the technical scope of the present disclosure should not be construed as being limited by the above-described aspects. In addition, the present disclosure may be appropriately modified and changed to be implemented in various aspects without departing from the spirit and scope of the present disclosure. For example, it should be understood that an aspect in which some components of one aspect are added to another aspect, or an aspect in which some components of one aspect are replaced with some components of another aspect are also an aspect to which the present disclosure can be applied.

In the above-described aspect, the device configuration of the display device 1 or the like is merely an example and is not limited to the illustrated one. For example, the display device 1 may be not an OLED display but may be a liquid crystal display, a cathode ray tube (CRT) display, or the like. Since it is desirable that the display device 1 is a display capable of efficiently transmitting a vibration from the piezoelectric element 10 to the display panel 20, an OLED display with few cavities is particularly desirable.

According to the present disclosure, sound quality can be improved in a display device which emits a sound from a display panel.

What is claimed is:

1. A display device comprising:
    a piezoelectric element vibrating in accordance with input audio signals;
    a display panel configured to display an image; and
    an elastic member configured to connect a portion of the piezoelectric element and the display panel so as to transmit a vibration of the piezoelectric element to the display panel,
    wherein at least one end of the piezoelectric element is not connected to the elastic member and there is a gap between the piezoelectric element and a rear surface of the display panel,
    wherein the piezoelectric element includes:
    a first electrode directly connected to the elastic member, wherein a horizontal length of the elastic member is shorter than that of the first electrode;
    a first piezoelectric layer disposed on the first electrode;
    a second electrode disposed on the first piezoelectric layer;
    a second piezoelectric layer disposed on the second electrode; and
    a third electrode disposed on the second piezoelectric layer,
    wherein polarization directions of the first piezoelectric layer and the second piezoelectric layer are the same,
    wherein the input audio signals having a same phase are input to the first electrode and the third electrode,
    wherein the first piezoelectric layer and the second piezoelectric layer are deformed in different directions,
    wherein the piezoelectric element and the elastic member have different shapes, and
    wherein the elastic member has a non-rectangular shape.

2. The display device of claim 1, wherein the piezoelectric element has a flat plate shape, and the elastic member is connected to a main surface of the piezoelectric element.

3. The display device of claim 2, wherein the piezoelectric element has a rectangular shape having a long side direction and a short side direction in a plan view, and the elastic member is connected at a position including a center of the piezoelectric element in the long side direction.

4. The display device according to claim 3, wherein an end of the piezoelectric element in the long side direction is not connected to the elastic member.

5. The display device of claim 3, wherein the long side direction is perpendicular to at least a part of ends of the display panel.

6. The display device of claim 1, wherein the piezoelectric element are vibrated to be bent in a thickness direction thereof.

7. The display device of claim 1, wherein the first electrode and the second electrode are disposed such that the first piezoelectric layer is interposed therebetween in a thickness direction thereof, and
    wherein the second electrode and the third electrode are disposed such that the second piezoelectric layer is interposed therebetween in a thickness direction thereof.

8. The display device of claim 1, wherein the elastic member is connected only to a central portion of the first electrode.

9. The display device of claim 1, wherein the piezoelectric element has a rectangular shape having a long side direction and a short side direction in a plan view, and the elastic member has a circular shape in a plan view.

* * * * *